United States Patent [19]

Sumida

[11] Patent Number: 5,543,661
[45] Date of Patent: Aug. 6, 1996

[54] SEMICONDUCTOR CERAMIC PACKAGE WITH TERMINAL VIAS

[75] Inventor: Reiko Sumida, Mine, Japan

[73] Assignee: Sumitomo Metal Ceramics Inc., Mine, Japan

[21] Appl. No.: 448,855

[22] Filed: May 24, 1995

[30] Foreign Application Priority Data

May 31, 1994 [JP] Japan .................................. 6-142355

[51] Int. Cl.$^6$ ............................. H01L 23/10; H01L 23/34
[52] U.S. Cl. .................... 257/707; 257/69.1; 257/700; 257/706; 257/713; 257/774
[58] Field of Search ..................................... 257/691, 700, 257/701, 712, 713, 719, 720, 774, 705, 707

[56] References Cited

FOREIGN PATENT DOCUMENTS 901159848  2/1991  European Pat. Off. ............... 257/700
3-286590  12/1991  Japan .
4-35053  2/1992  Japan .

*Primary Examiner*—Sara W. Crane
*Assistant Examiner*—Carl Whitehead, Jr.
*Attorney, Agent, or Firm*—Foley & Lardner

[57] ABSTRACT

A semiconductor ceramic package includes a plurality of laminated insulator layers each formed from a ceramic. A semiconductor chip mounting portion is formed on a surface insulator layer. A power plane is formed on at least one of internal insulator layers. A ground plane is also formed on at least one of internal insulator layers. A plurality of thermal vias are formed beneath the semiconductor chip mounting portion. Each thermal via includes a first thermal via formed so as to transmit heat generated by a semiconductor chip mounted on the semiconductor chip mounting portion to the side of a back surface layer and a second thermal via formed so as to transmit the heat generated by the semiconductor chip to the side of the back surface layer. The first thermal via is connected to the power plane and the second thermal via is connected to the ground plane. The first and second thermal vias are formed to be adjacent to each other.

11 Claims, 10 Drawing Sheets

SEMICONDUCTOR CERAMIC PACKAGE WITH TERMINAL VIAS

BACKGROUND OF THE INVENTION

1. Field of the Invention

This invention relates generally to semiconductor ceramic packages composed of a plurality of laminated insulator layers, and more particularly to such a semiconductor ceramic package having a power plane and a ground plane on internal insulator layers respectively and thermal vias for thermal dissipation beneath a semiconductor chip mounting portion thereof on which a semiconductor chip is mounted.

2. Description of the Prior Art

A semiconductor ceramic package on which a semiconductor chip is mounted has conventionally been provided with through holes or via holes formed beneath a semiconductor chip mounting portion for the purpose of improvement of thermal dissipation characteristic. The via holes are filled with a metal paste having high thermal conductivity, such as tungsten or silver, so that thermal vias are constituted. As shown in FIGS. 10 to 12, conventional thermal vias 4 are formed so as to be at an independent potential from a power plane 1 and a ground plane 2. Alternatively, the thermal vias 4 are connected to the ground plane 2 so as to be at a ground potential as shown in FIGS. 13 to 15. In each case, heat generated by operation of the semiconductor chip is efficiently conducted through the thermal vias 4 to the back surface of the package. The thermal vias 4 are usually independent electrically and insulated from other conductive patterns and pattern connecting vias (through holes). Alternatively, all the thermal vias 4 are connected together so as to be at the same potential and in some cases, further connected to the ground so as to be at a ground potential. Publication Nos. 3-286590 and 4-35053 of Japanese unexamined patent applications disclose the above-described conventional arrangement.

Reduction in resistance and impedance of an electrical power system of the package has recently become an important problem due to high speed operation of the semiconductor chip. For example, in semiconductor chips having a low input impedance, such as emitter-coupled logic (ECL), the potential of the electrical power system is varied by voltage drop due to high resistance of the power system, which results in malfunction of the chip. Furthermore, when the inductance of the electrical power system is high, particularly, in microprocessing units (MPU), the switching of the semiconductor chip causes fluctuation of the potential of the electrical power system of the package, which fluctuation is referred to as "ground bounce."

The prior art has proposed the following measures to prevent the malfunction of the semiconductor chip and occurrence of the ground bounce in the above-described type semiconductor ceramic packages. First, the semiconductor ceramic package wirings are designed so that the resistance at the power system is lowered as much as possible for prevention of voltage drop and so that the inductance of the power system is reduced for prevention of occurrence of the ground bounce. Second, a capacitance is provided between a power supply and the ground as measures against the ground bounce.

In the semiconductor ceramic packages having the thermal vias, however, these thermal vias are formed beneath the semiconductor chip mounting portion so as to penetrate through the package. Accordingly, the above-described measures cannot be taken for the semiconductor ceramic packages for the following reasons. First, presence of the thermal vias prevents an area of the conductor of the power system from being increased when the thermal vias are electrically independent and insulated from the other conductive patterns or pattern connecting vias (through holes) or when all the thermal vias are connected together so as to be at the same potential. Furthermore, there is a definite limit when a number of thermal vias are formed in the remaining area. Second, when all the thermal vias are electrically connected together, the resistance and the inductance (loop inductance) at the power system cannot be reduced though the resistance at the ground system is reduced. Furthermore, the capacitance between the power supply and the ground cannot be provided in a portion beneath the semiconductor chip mounting portion, in which portion the thermal vias are formed.

SUMMARY OF THE INVENTION

Therefore an object of the present invention is to provide a semiconductor ceramic package wherein an effective inductance can be reduced with the increase in a mutual inductance between the thermal vias, the capacitance between the power supply and the ground can be increased, and the electric characteristics can be improved.

To achieve the object, the present invention provides a semiconductor ceramic package comprising a power plane and a ground plane which are formed on internal insulator layers respectively and thermal vias formed beneath a semiconductor chip mounting portion. The thermal vias include a first thermal via connected to the power plane and a second thermal via connected to the ground plane.

According to the above-described arrangement, an area where the thermal vias are provided is connected to the power or ground plane. Consequently, the area of each conductor can be increased.

A plurality of first and second thermal vias may be formed alternately to be adjacent to each other in the above-described arrangement. Consequently, a mutual inductance between the first and second thermal vias can reduce an effective inductance in the power supply system.

A plurality of power planes connected to a plurality of first thermal vias and a plurality of ground planes connected to a plurality of second thermal vias may be laminated with each insulator layer being interposed between each power plane and each adjacent ground plane. Consequently, an area of each conductor can be increased and a capacitance can be increased between a power supply and the ground.

At least one insulator layer is interposed for insulation between an upper end of the first thermal via and the ground plane of the semiconductor chip mounting portion when the present invention is applied to a semiconductor ceramic package wherein the semiconductor chip mounting portion is formed with the ground plane to which a backside of the semiconductor chip is joined. In this arrangement, when the power plane is formed beneath the semiconductor chip mounting portion with one insulator layer being interposed therebetween and the upper end of the first thermal via is connected to the power plane, a desirable thermal dissipation can be secured even if the first thermal via is not connected directly to the semiconductor chip mounting portion.

BRIEF DESCRIPTION OF THE DRAWINGS

Other objects, features and advantages of the present invention will become clear upon reviewing the following description of preferred embodiments thereof, made with reference to the accompanying drawings, in which.

DESCRIPTION OF THE PREFERRED EMBODIMENTS

Figure 1:
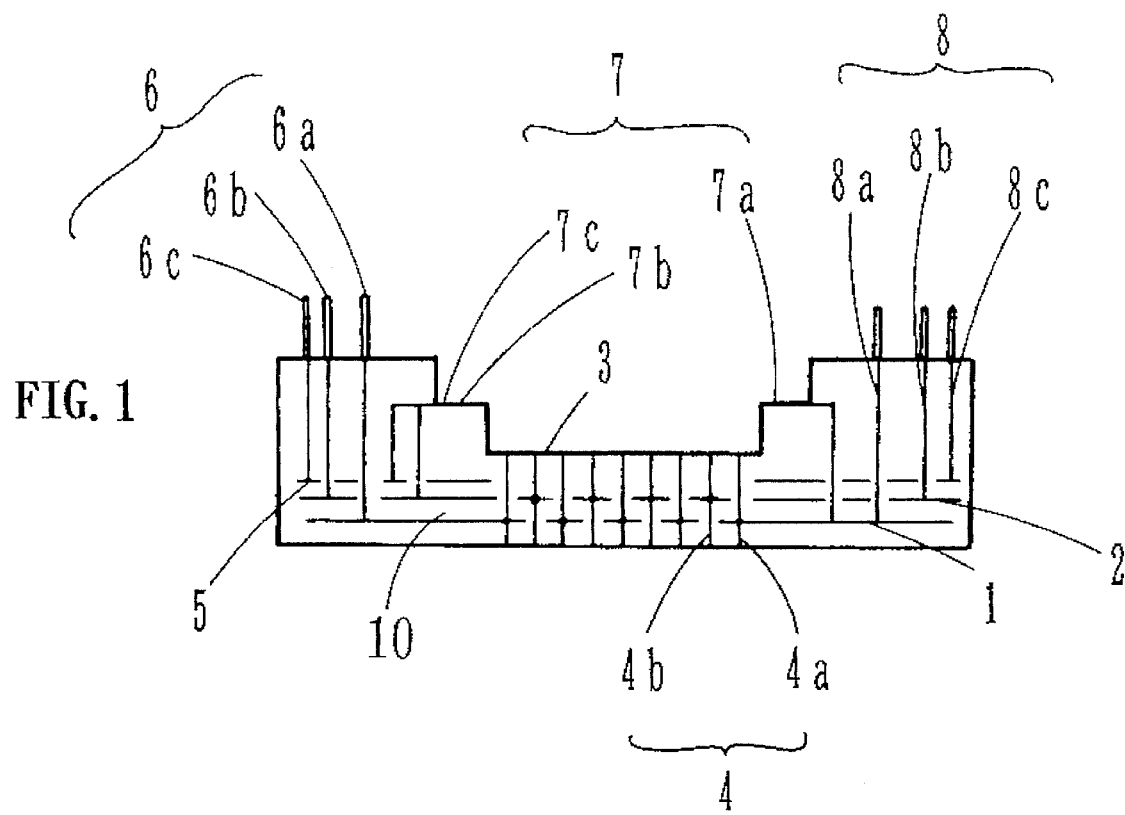
FIG. 1 is a longitudinal section of a semiconductor ceramic package of a first embodiment in accordance with the present invention.
Figure 2:
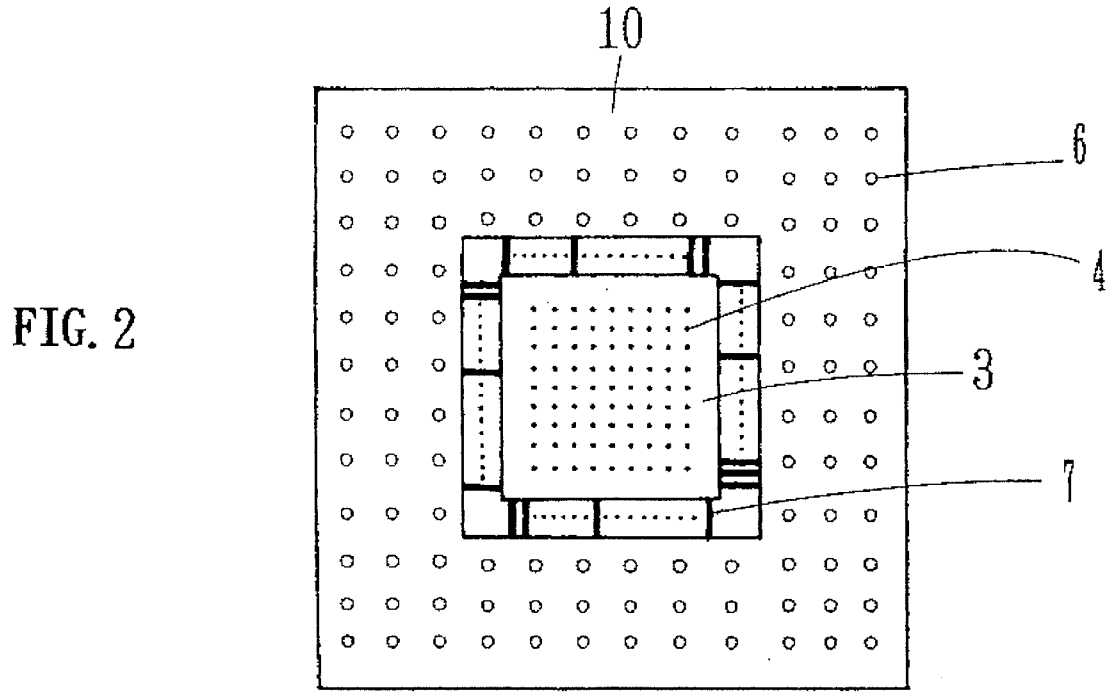
FIG. 2 is a plan view of the package.
Figure 3:
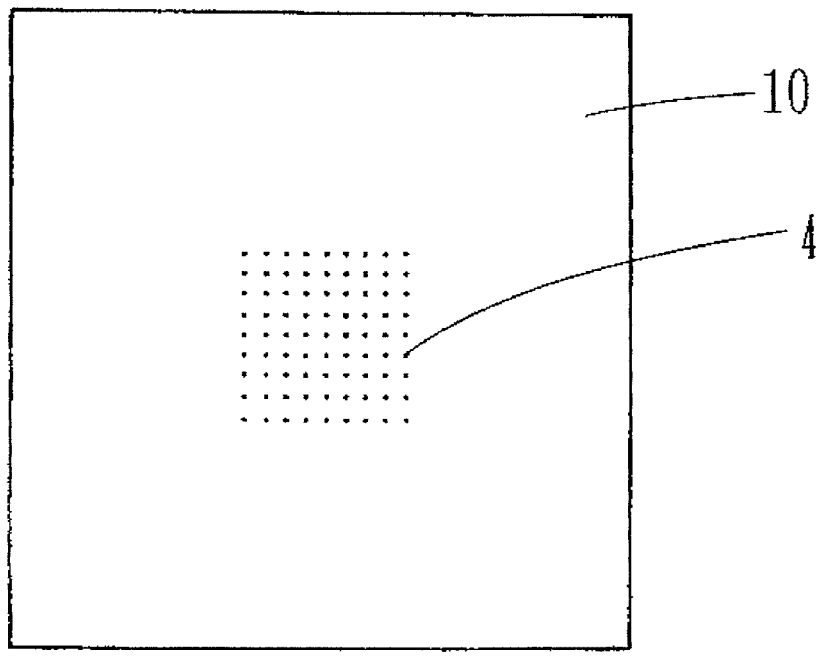
FIG. 3 is a bottom view of the package.
Figure 4:
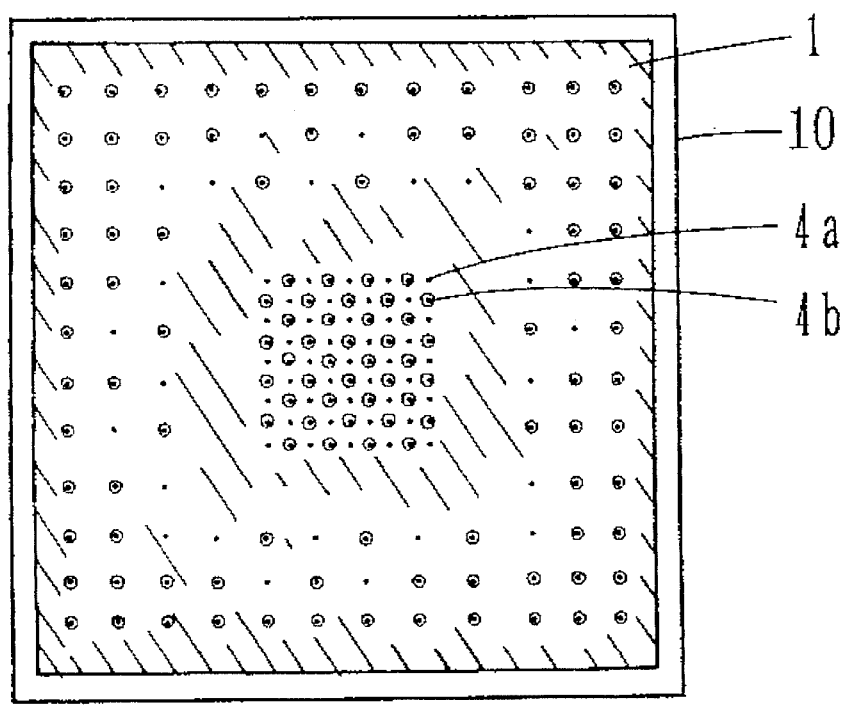
FIG. 4 is a plan view of a power plane of the package.
Figure 5:
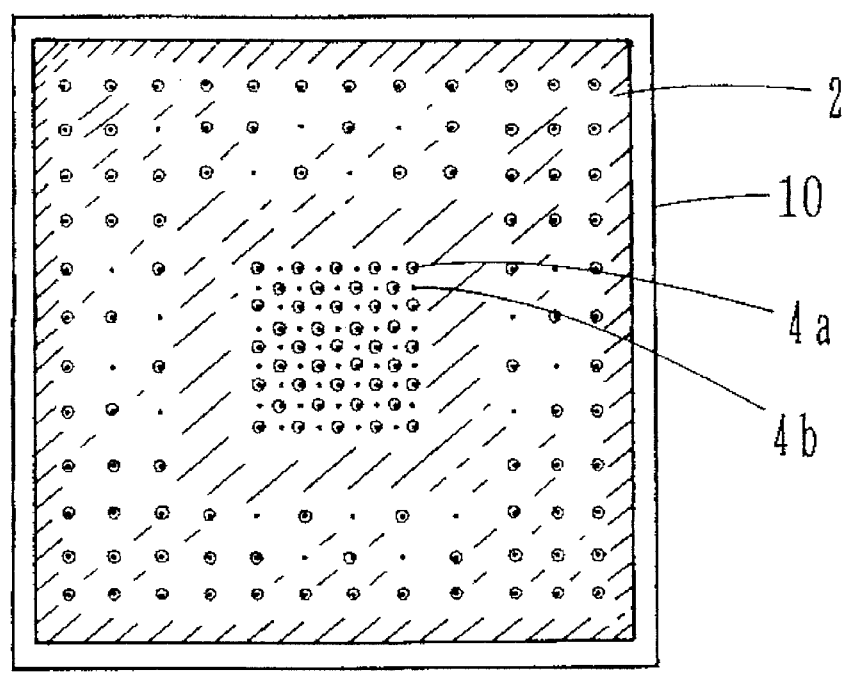
FIG. 5 is a plan view of a ground plane of the package.
Figure 6:
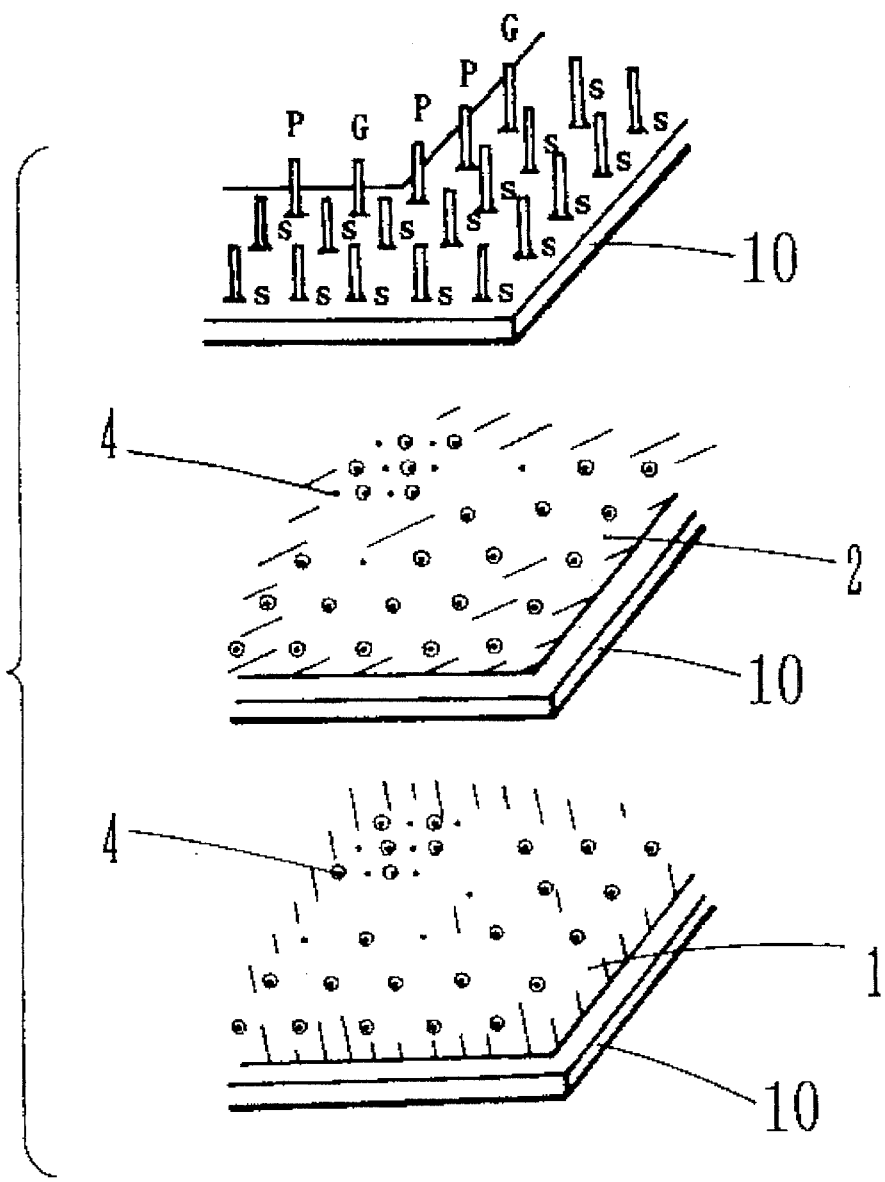
FIG. 6 is an exploded perspective view of the package.

A first embodiment of the present invention will be described with reference to FIGS. 1 to 6. The invention is applied to a semiconductor ceramic package of the pin grid array (PGA) type in the first embodiment. The package comprises a plurality of laminated insulator layers 10 formed from a ceramic. At least one of internal insulator layers 10 has a power plane 1 and at least one of the other internal insulator layers has a ground plane 2. A surface insulator layer 10 has a centrally formed concave semiconductor chip mounting portion 3 on which a semiconductor chip (not shown) is to be mounted. The package has a number of thermal vias 4 formed beneath the semiconductor chip mounting portion 3 and filled with a metal paste. More specifically, a number of through holes or via holes are formed in green sheets made from ceramics, for example, alumina or glass-alumina material serving as the insulator layers 10. Each via hole is filled with the electrically conductive metal paste such as tungsten, silver or copper. A conductive pattern such as the power plane, ground plane or wiring pattern is printed on the surface of each green sheet by means of a screen printing. Subsequently, a plurality of such green sheets are laminated one upon another and then sintered into a ceramic package. External terminals 6 for connection to a power supply and the ground and for signal transmission are provided on the surface of the package. Internal terminals 7 for connection to the power supply and the ground and for signal transmission are also provided on the surface of the package.

The power plane 1 and the ground plane 2 provided on the respective internal insulator layers are formed by printing conductive patterns on the surfaces of the green sheets. Each of the power and ground planes 1 and 2 is connected through the vias 8a and 8b to external power and ground terminals 6a and 6b provided on the surface of the package, an internal power terminal 7a (wire bonding pattern) and an internal ground terminal 7b both provided in the vicinity of the semiconductor chip mounting portion 3, which vias 8a and 8b are each filled with the metal paste such as tungsten, silver or copper. The planes are further connected to the thermal vias 4. The wiring pattern layer 5 is connected through the via 8c to the external and internal signal terminals 6c and 7c.

Each thermal via 4 includes a first or power-supply connected thermal via 4a and a second or ground connected thermal via 4b. The power-supply connected thermal via 4a is connected to the power plane 1 in the internal insulator layer of the package so as to be maintained at the power supply potential. The ground connected thermal via 4b is connected to the ground plane 2 so as to be maintained at the ground potential. More specifically, as shown in FIG. 1, each power-supply connected thermal via 4a penetrates through the ground plane 2 in an insulated relation and is connected to the power plane 1 to be maintained at the power supply potential. Each ground connected thermal via 4b penetrates through the power plane 1 and is connected to the ground plane 2 to be maintained at the ground potential. An upper end of each of the thermal vias 4a and 4b reaches the semiconductor chip mounting portion 3 so that heat generated by a semiconductor chip mounted on the semiconductor chip mounting portion 3 is readily transmitted to the thermal vias 4a and 4b.

The power-supply connected thermal vias 4a and the ground connected thermal vias 4b are disposed alternately to be adjacent to each other so that a mutual inductance is increased between the power-supply and ground connected thermal vias 4a and 4b. Thus, a number of power-supply and ground connected thermal vias 4a and 4b are disposed in close formation. The thermal vias 4a and 4b are usually spaced at intervals of 100 to 1,500 μm. Each of the thermal vias 4a and 4b usually has the diameter of 50 to 1,000 μm. Furthermore, the thermal vias 4 may include an electrically independent via which is connected neither to the power plane 1 nor to the ground plane 2.

According to the semiconductor ceramic package of the embodiment, the thermal vias 4 are disposed beneath the semiconductor chip mounting portion 3 of the package. Accordingly, heat generated by the semiconductor chip mounted on the mounting portion 3 can be transmitted to the thermal vias 4 and efficiently dissipated by the heat conduction of the thermal vias 4 to the backside of the package. Furthermore, each thermal via 4 comprises the power-supply connected thermal via 4a connected to the power plane 1 and the ground connected thermal via 4b connected to the ground plane 2. Consequently, the area of each of the conductor layers 1 and 2 can be increased such that a resistance value and the inductance of the electrical power system can be reduced. Additionally, since the power-supply connected thermal vias 4a and the ground connected thermal vias 4b are disposed alternately, the mutual inductance can be increased between the thermal vias 4a and 4b, whereupon the effective inductance can be reduced in the power system.

In order that the operation and effect of the semiconductor ceramic package of the embodiment were confirmed, the values of the power-supply and ground resistance and the inductance were measured with regard to the package of the embodiment and the above-described prior art package. In the package of the embodiment, the resistance values and the inductance were reduced by about one third of those in the prior art package even when the internal and external terminals were located away from each other. Thus, an improvement in the electric characteristics were able to be confirmed in the package of the embodiment.

Figure 7:
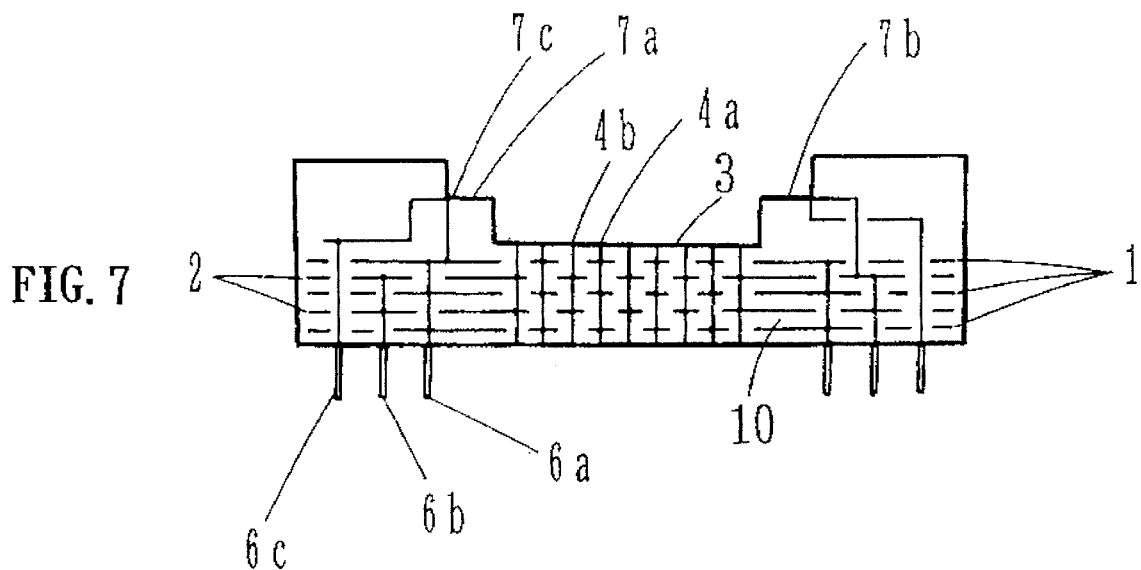
FIG. 7 is a longitudinal section of a semiconductor ceramic package of a second embodiment in accordance with the present invention.

FIG. 7 illustrates a second embodiment of the present invention. In the second embodiment, the power-supply connected thermal vias 4a and the ground connected thermal vias 4b are disposed alternately, and the power planes 1 and the ground planes 2 are laminated alternately with the insulator layers 10 being interposed therebetween. More specifically, three power planes 1 and two ground planes 2 are laminated alternately with the insulator layers 10 being interposed therebetween. The three power planes 1 are connected together by each power-supply connected thermal via 4a while the two ground planes 2 are connected together by each ground connected thermal via 4b, so that the area of each of the power planes 1 and the ground planes 2 is increased and the capacitance between the power supply and the ground is increased.

In the second embodiment, the power system inductance (a loop inductance) was able to be reduced by about one fourth of that in in the prior art. Furthermore, since the capacitance is increased to a value by about a quarter times as large as that in the prior art per dielectric layer, use of four dielectric layers is sufficient in the embodiment although five dielectric layers have been employed in the prior art. Consequently, the production efficiency of the packages can be improved and accordingly, the production cost of the packages can be reduced.

Figure 8:
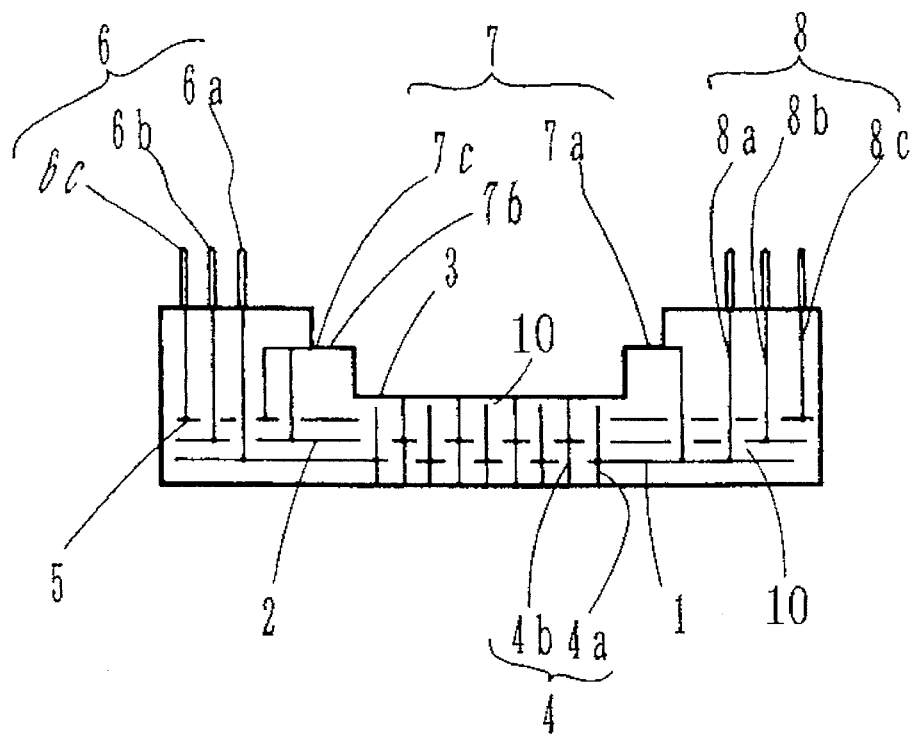
FIG. 8 is a longitudinal section of a semiconductor ceramic package of a third embodiment in accordance with the present invention.

The backside of the semiconductor chip is sometimes utilized as the ground in some types of the semiconductor ceramic packages. When such a semiconductor chip is mounted on the package, a ground plane is formed on the semiconductor chip mounting portion 3 as shown in FIG. 8 as a third embodiment of the invention. The backside of the semiconductor chip (not shown) is bonded to the ground plane of the mounting portion 3 with an electrically conductive adhesive agent. The upper end of each power-supply connected to the internal power plane 1 through the thermal via 4a does not reach the semiconductor chip mounting portion 3. At least one insulator layer 10 is interposed between the upper ends of the power-supply connected thermal vias 4a and the ground plane of the semiconductor chip mounting portion 3. On the other hand, the upper end of each ground connected thermal via 4b is connected to the ground plane of the semiconductor chip mounting portion 3. Each ground connected thermal via 4b is also connected to the internal ground plane 2. The other arrangement of the package is identical with that in the foregoing first embodiment and accordingly, the same effect can be achieved in the third embodiment as in the first embodiment. In the third embodiment, particularly, the ground of the semiconductor chip mounted on the mounting portion 3 can be connected to a capacitor (not shown) at the backside of the package by the ground connected thermal via 4b at a shortest distance. Consequently, since the inductance between the capacitor and the semiconductor chip can be reduced, an antinoise characteristic of the package can be improved.

Figure 9:
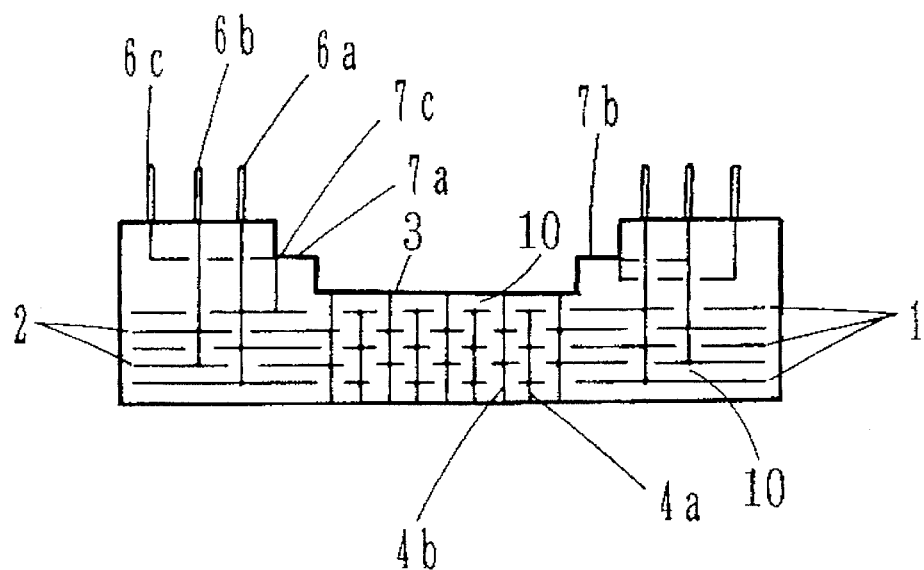
FIG. 9 is a longitudinal section of a semiconductor ceramic package of a fourth embodiment in accordance with the present invention.
Figure 10:
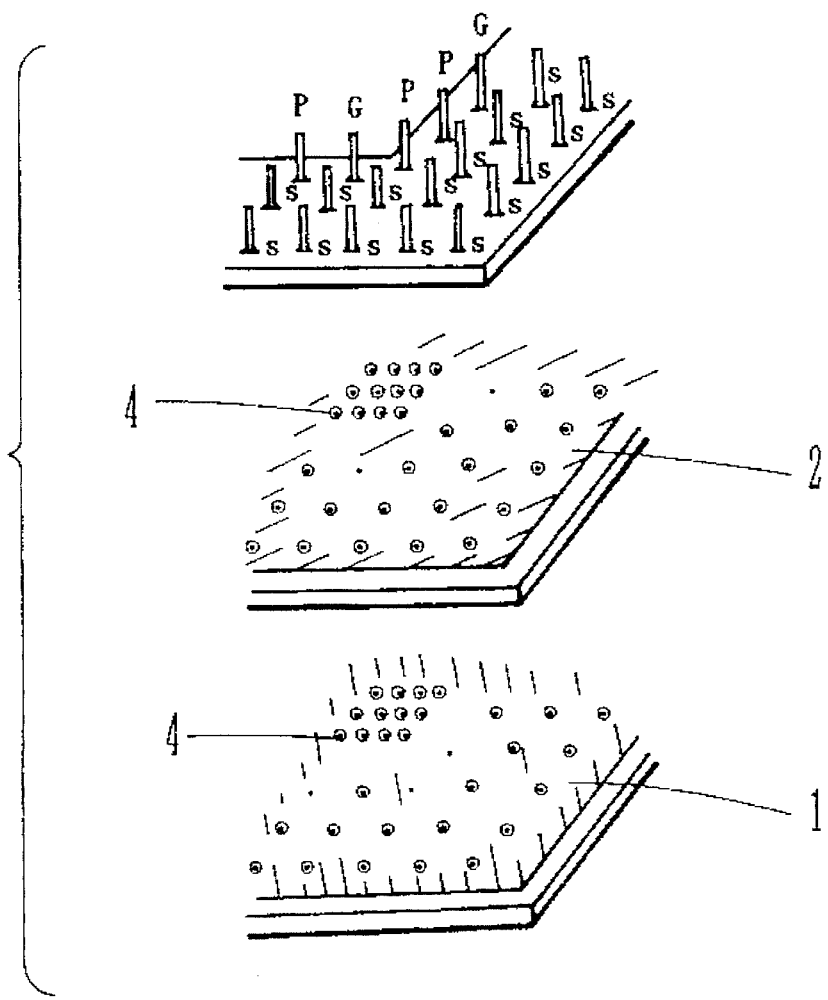
FIG. 10 is an exploded perspective view of a prior art semiconductor ceramic package in which each thermal via has a separate potential.
Figure 11:
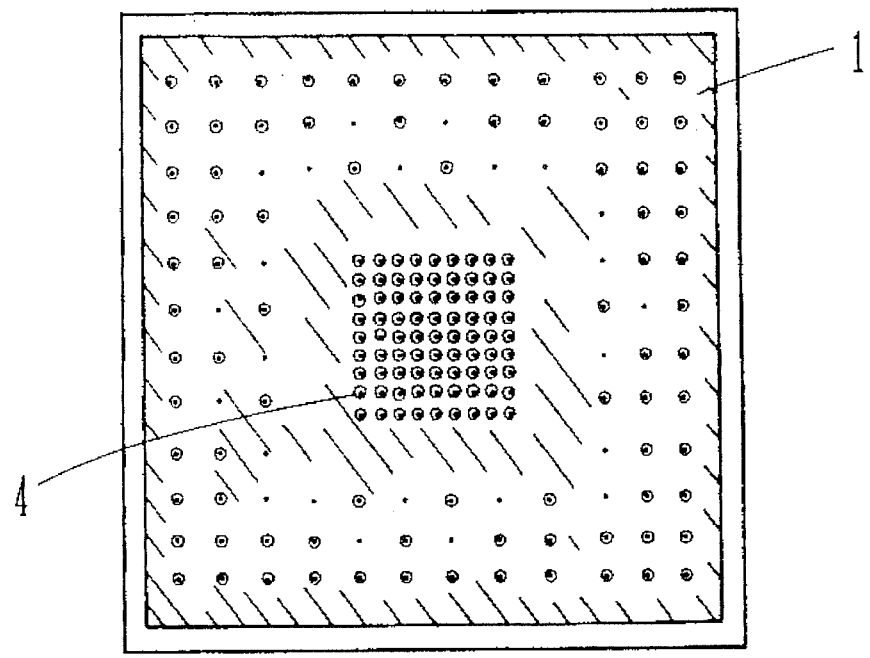
FIG. 11 is a plan view of a power plane employed in the prior art package.
Figure 12:
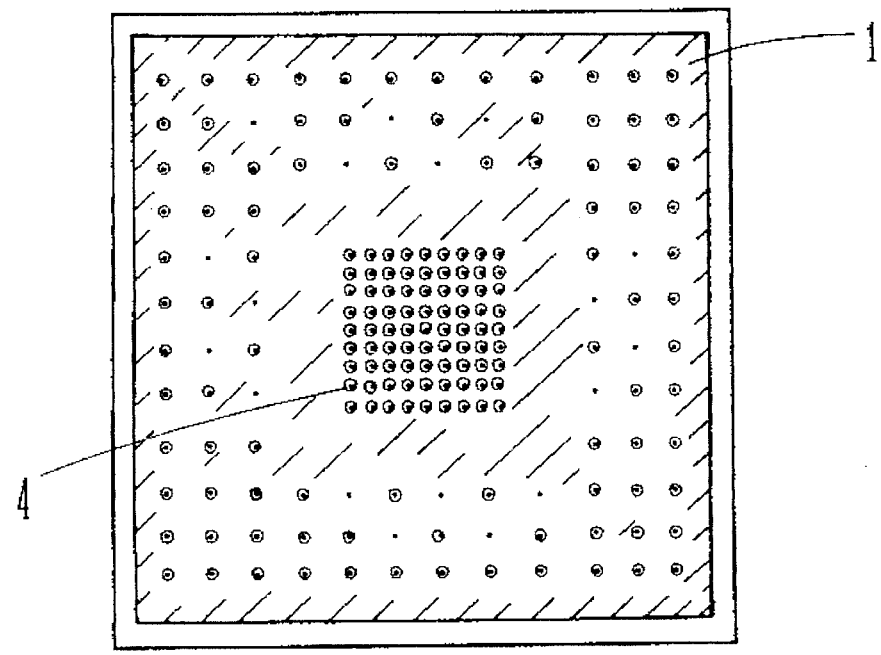
FIG. 12 is a plan view of a ground plane employed in the prior art package.
Figure 13:
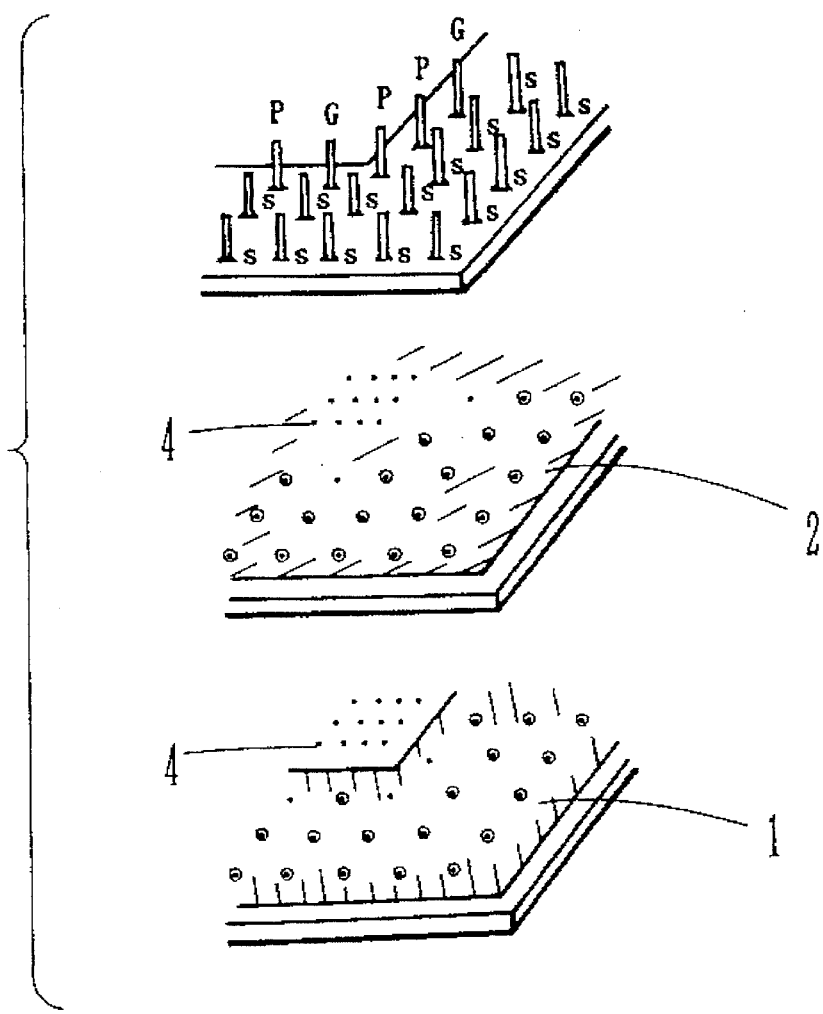
FIG. 13 is an exploded perspective view of another prior art semiconductor ceramic package in which all the thermal vias are connected together so as to be at the same potential.
Figure 14:
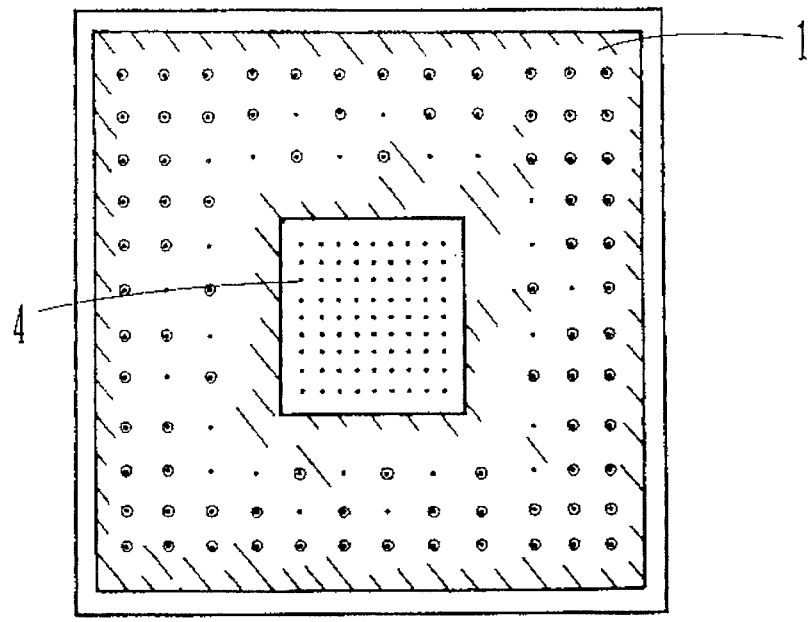
FIG. 14 is a plan view of a power plane employed in said another prior art package.
Figure 15:
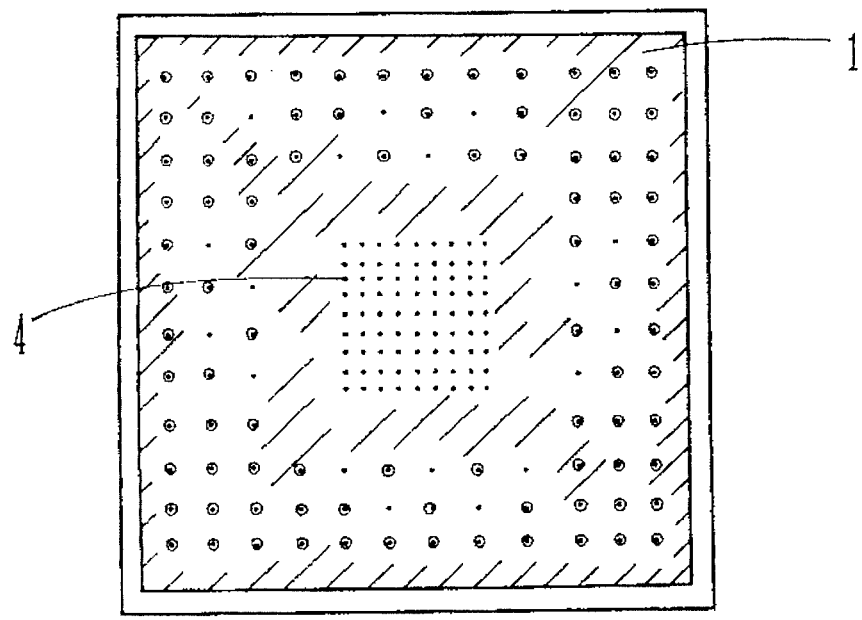
FIG. 15 is a plan view of a ground plane employed in said another prior art package.

FIG. 9 illustrates a fourth embodiment of the invention. The ground plane is formed on the semiconductor chip mounting portion 3, to which ground plane the backside of the semiconductor chip (not shown) is bonded with the adhesive agent in the same manner as in the third embodiment. The upper end of each power-supply connected thermal via 4a connected to the internal power plane 1 does not reach the semiconductor chip mounting portion 3. One insulator layer 10 is interposed between the upper ends of the power-supply connected thermal vias 4a and the ground plane of the semiconductor chip mounting portion 3. Furthermore, one of power planes 1 is formed beneath the semiconductor chip mounting portion 3 with a single insulator layer 10 being interposed therebetween. The upper end of each power-supply connected thermal via 4a is connected to the power plane 1. The other arrangement of the package is identical with that in the foregoing second embodiment and accordingly, the same effect can be achieved in the fourth embodiment as in the second embodiment.

In the fourth embodiment, particularly, the upper end of each power-supply connected thermal via 4a is connected to the power plane 1 formed beneath the semiconductor chip mounting portion 3 with the single insulator layer 10 being interposed therebetween. Consequently, satisfactory thermal dissipation can be achieved. More specifically, the single insulator layer 10 is so thin that the heat in the semiconductor chip mounting portion 3 can be readily transmitted to the power plane 1 therethrough. The power plane 1 thus serves to receive the heat in the mounting portion 3 and to transmit the received heat to the power-supply connected thermal via 4a.

Although the present invention has been applied to the semiconductor ceramic package of the PGA type in the foregoing embodiments, the invention may be applied to the packages of various multilayer types such as quad flat packages (QFPG).

The foregoing description and drawings are merely illustrative of the principles of the present invention and are not to be construed in a limiting sense. Various changes and modifications will become apparent to those of ordinary skill in the art. All such changes and modifications are seen to fall within the true spirit and scope of the invention as defined by the appended claims.

We claim:

1. A semiconductor ceramic package comprising:
   (a) a plurality of laminated insulator layers each formed from a ceramic, said plurality of laminated insulator layers including internal insulator layers;
   (b) a semiconductor chip mounting portion formed on a surface insulator layer;
   (c) a power plane formed in at least one of the internal insulator layers;
   (d) a ground plane formed in at least one of the internal insulator layers;
   (e) a first thermal via formed so as to transmit heat generated by a semiconductor chip mounted on the semiconductor chip mounting portion to a back surface of the package, the first thermal via being connected to the power plane; and
   (f) a second thermal via formed so as to transmit the heat generated by the semiconductor chip to the back surface of the package, the second thermal via being connected to the ground plane.

2. A semiconductor ceramic package according to claim 1, wherein a plurality of first and second thermal vias are formed alternately to be adjacent to each other.

3. A semiconductor ceramic package according to claim 1, wherein a plurality of power planes connected to a plurality of first thermal vias and a plurality of ground planes connected to a plurality of second thermal vias are laminated with one of the plurality of laminated insulator layers being interposed between adjacent power planes and ground planes.

4. A semiconductor ceramic package according to claim 2, wherein a plurality of power planes connected to the plurality of first thermal vias and a plurality of ground planes connected to the plurality of second thermal vias are laminated with one of the plurality of laminated insulator layers being interposed between adjacent power planes and ground planes.

5. A semiconductor ceramic package according to claim 1, wherein the semiconductor chip mounting portion is formed with a ground plane to which a backside of the semiconductor chip is joined, and at least one of the plurality of laminated insulator layers is interposed for insulation between an upper end of the first thermal via and the ground plane of the semiconductor chip mounting portion.

6. A semiconductor ceramic package according to claim 5, wherein the power plane is formed beneath the semiconductor chip mounting portion with at least one of the plurality of laminated insulator layers being interposed therebetween, and the upper end of the first thermal via is connected to the power plane.

7. A semiconductor ceramic package according to claim 5, wherein a plurality of first and second thermal vias are formed alternately to be adjacent to each other.

8. A semiconductor ceramic package according to claim 5, wherein a plurality of power planes connected to a plurality of first thermal vias and a plurality of ground planes connected to a plurality of second thermal vias are laminated with one of the plurality of laminated insulator layers being interposed between adjacent power planes and ground planes.

9. A semiconductor ceramic package according to claim 6, wherein a plurality of first and second thermal vias are formed alternately to be adjacent to each other.

10. A semiconductor ceramic package according claim 6, wherein a plurality of power planes connected to a plurality of first thermal vias and a plurality of ground planes connected to a plurality of second thermal vias are laminated with one of the plurality of laminated insulator layers being interposed between adjacent power planes and ground planes.

11. A semiconductor ceramic package according to claim 9, wherein a plurality of power planes connected to the plurality of first thermal vias and a plurality of ground planes connected to the plurality of second thermal vias are laminated with one of the plurality of laminated insulator layers being interposed between adjacent power planes and ground planes.

* * * * *